(12) United States Patent
Shah

(10) Patent No.: US 7,329,958 B1
(45) Date of Patent: Feb. 12, 2008

(54) METHOD AND APPARATUS WITH POWER AND GROUND STRIPS FOR CONNECTING TO DECOUPLING CAPACITORS

(75) Inventor: Jitesh Shah, Fremont, CA (US)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 11/536,210

(22) Filed: Sep. 28, 2006

(51) Int. Cl.
*H01L 23/52* (2006.01)
*H01L 21/44* (2006.01)

(52) U.S. Cl. ...................... 257/778; 438/108

(58) Field of Classification Search ............... 257/668, 257/669, 786, 676, 700, 778–782, E27.144, 257/E27.161; 361/306, 715, 794; 438/108, 438/123, 611–618
See application file for complete search history.

(56) References Cited

U.S. PATENT DOCUMENTS

| | | | |
|---|---|---|---|
| 5,212,402 A | 5/1993 | Higgins | |
| 5,459,634 A * | 10/1995 | Nelson et al. | ........... 361/306.3 |
| 6,075,211 A | 6/2000 | Tohya et al. | |
| 6,222,246 B1 | 4/2001 | Mak et al. | |
| 6,521,994 B1 | 2/2003 | Huse et al. | |
| 6,627,999 B2 | 9/2003 | Akram et al. | |
| 6,717,257 B2 | 4/2004 | Corisis et al. | |
| 6,806,564 B2 | 10/2004 | Terui et al. | |
| 6,924,562 B2 | 8/2005 | Kinoshita | |
| 2003/0045083 A1* | 3/2003 | Towle et al. | ................. 438/612 |
| 2006/0087028 A1 | 4/2006 | Goto et al. | |

* cited by examiner

*Primary Examiner*—Calvin Lee
(74) *Attorney, Agent, or Firm*—Glass & Associates; Kenneth Glass

(57) ABSTRACT

A package for a flip-chip integrated circuit device and a packaged flip-chip integrated circuit device that include ground strips and power strips disposed on the top surface of the package substrate. Decoupling capacitors are disposed over and electrically coupled to a ground strip and are disposed over and electrically coupled to a power strip. Microvias electrically couple the power strips to a power plane and electrically couple the ground strip to a ground plane. Each power strip and ground strip extend within a die attach region of the package substrate such that a semiconductor die can be bonded thereto for coupling power and ground between the semiconductor die and the decoupling capacitors. The power strip and ground strip provide low impedance pathways between the flip-chip semiconductor die and the decoupling capacitors. Thereby, effective decoupling capacitance is provided that is suitable for high frequency applications.

14 Claims, 5 Drawing Sheets

METHOD AND APPARATUS WITH POWER AND GROUND STRIPS FOR CONNECTING TO DECOUPLING CAPACITORS

BACKGROUND

Description of Related Art

Decoupling capacitors are commonly used for supplying charge to integrated circuit devices. In conventional flip-chip packages that include decoupling capacitors, each decoupling capacitor is placed on the top layer of the flip-chip substrate over microvias that electrically couple the decoupling capacitor to power and ground layers of the flip-chip substrate. More particularly, a microvia extends between the decoupling capacitor and the ground layer and a different microvia extends between the decoupling capacitor and the power layer.

Microvias that extend from the power layer to the top surface of the flip-chip substrate connect to the flip-chip through solder bumps. Similarly, microvias that extend from the ground layer to the top surface of the flip-chip substrate connect to the flip-chip through solder bumps. Thus, in a conventional flip-chip package each interconnect path between the flip-chip and a decoupling capacitor includes two microvias. These microvias increase the impedance of the interconnect path. This increased impedance can render the decoupling capacitors ineffective in high frequency switching applications.

Accordingly, there is a need for a method and apparatus that provides a low impedance interconnect path between the flip-chip and a decoupling capacitor. Moreover, there is a need for a package for an integrated circuit device and a packaged integrated circuit device that includes decoupling capacitors and a low impedance pathway for electrically connecting the decoupling capacitors to the flip-chip.

SUMMARY

A package for an integrated circuit device is disclosed that include ground strips and power strips disposed on the top surface of the package substrate. Decoupling capacitors are disposed over and electrically coupled to a ground strip and are disposed over and electrically coupled to a power strip. Microvias electrically couple the power strips to a power plane and electrically couple the ground strip to a ground plane. Each power strip and ground strip extends within a die attach region of the package substrate such that a semiconductor die can be bonded thereto for coupling power and ground between the semiconductor die and the decoupling capacitors.

In one aspect of the present invention, a packaged integrated circuit device is disclosed that includes a flip-chip semiconductor die that is electrically coupled to the ground strip and the power strip by solder bumps that extend between the power strip and the flip-chip semiconductor die and between the ground strip and the flip-chip semiconductor die. These solder bumps electrically couple the flip-chip semiconductor die to the ground strip and to the power strip.

The power strip and ground strip provide a low impedance pathway between the flip-chip semiconductor die and the decoupling capacitors. Thereby, effective decoupling capacitance is provided that is suitable for high frequency applications. Moreover, since the electrical pathway between the flip-chip semiconductor die and the decoupling capacitors does not have to pass through any microvias, the impedance of the electrical pathway between the flip-chip semiconductor die and the decoupling capacitors is significantly less than that of prior art packages that include multiple microvias between the flip-chip semiconductor die and decoupling capacitors.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

In one aspect of the present invention a method for forming a package for a flip-chip semiconductor device is disclosed in which a package substrate is formed that includes ground strips disposed on the top surface of the package substrate and power strips disposed on the package substrate. Decoupling capacitors are then coupled to the package substrate such that each decoupling capacitor is disposed over and electrically coupled to a ground strip and such that each decoupling capacitor is disposed over and electrically coupled to a power strip.

A packaged semiconductor device can then be formed by coupling a flip-chip semiconductor device to the package substrate such that contact pads on the semiconductor die for coupling ground to the semiconductor die are electrically coupled to the ground strip and such that contact pads on the semiconductor die for coupling power to the semiconductor die are electrically coupled to the power strip. Encapsulant can then be disposed over the semiconductor die to form a packaged flip-chip semiconductor device.

Figure 1:
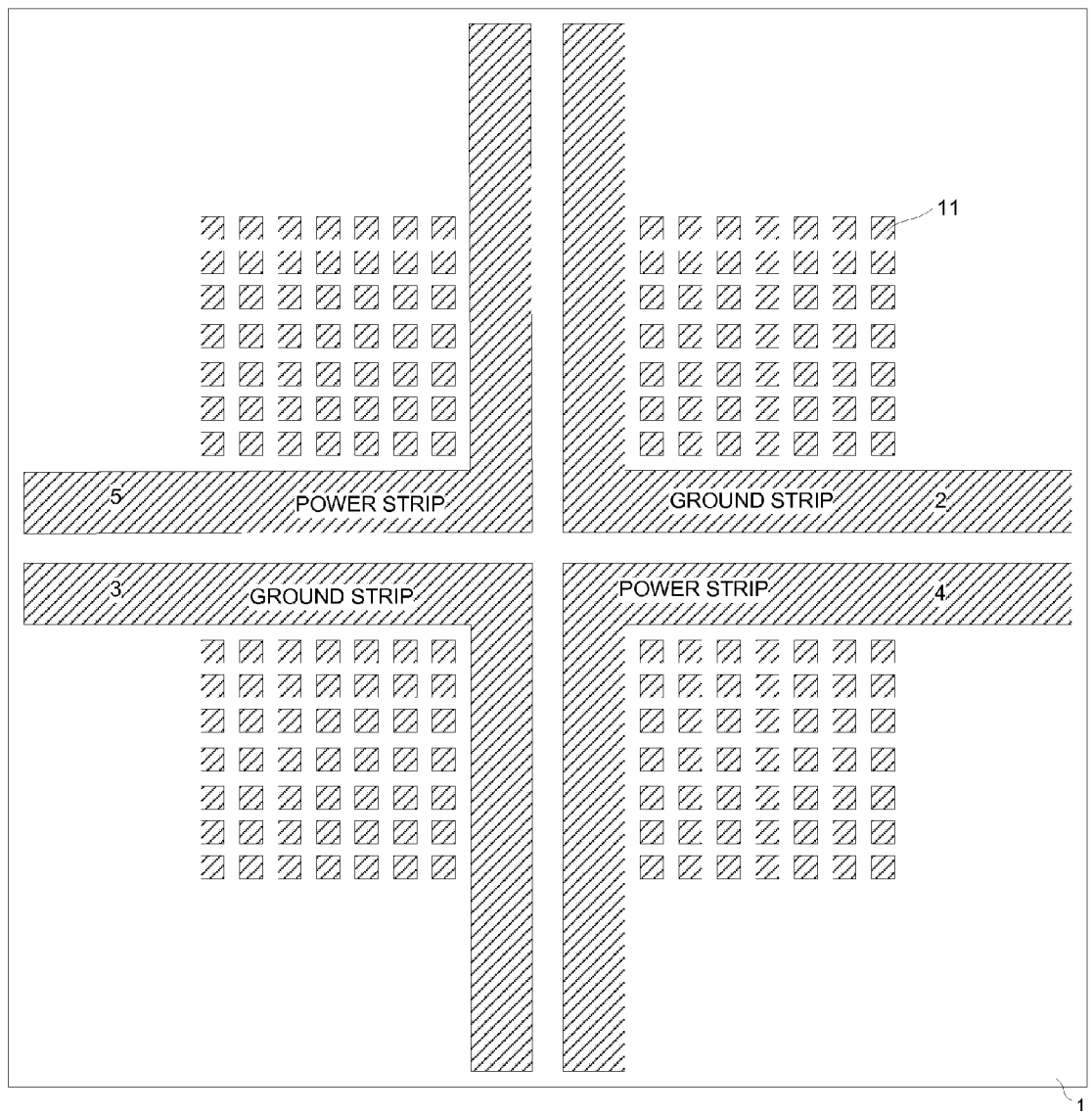
FIG. 1 is a top view of a flip-chip package substrate that has power strips, ground strips and contacts formed over the top surface of the package substrate, in accordance with an embodiment of the present invention.
Figure 2:
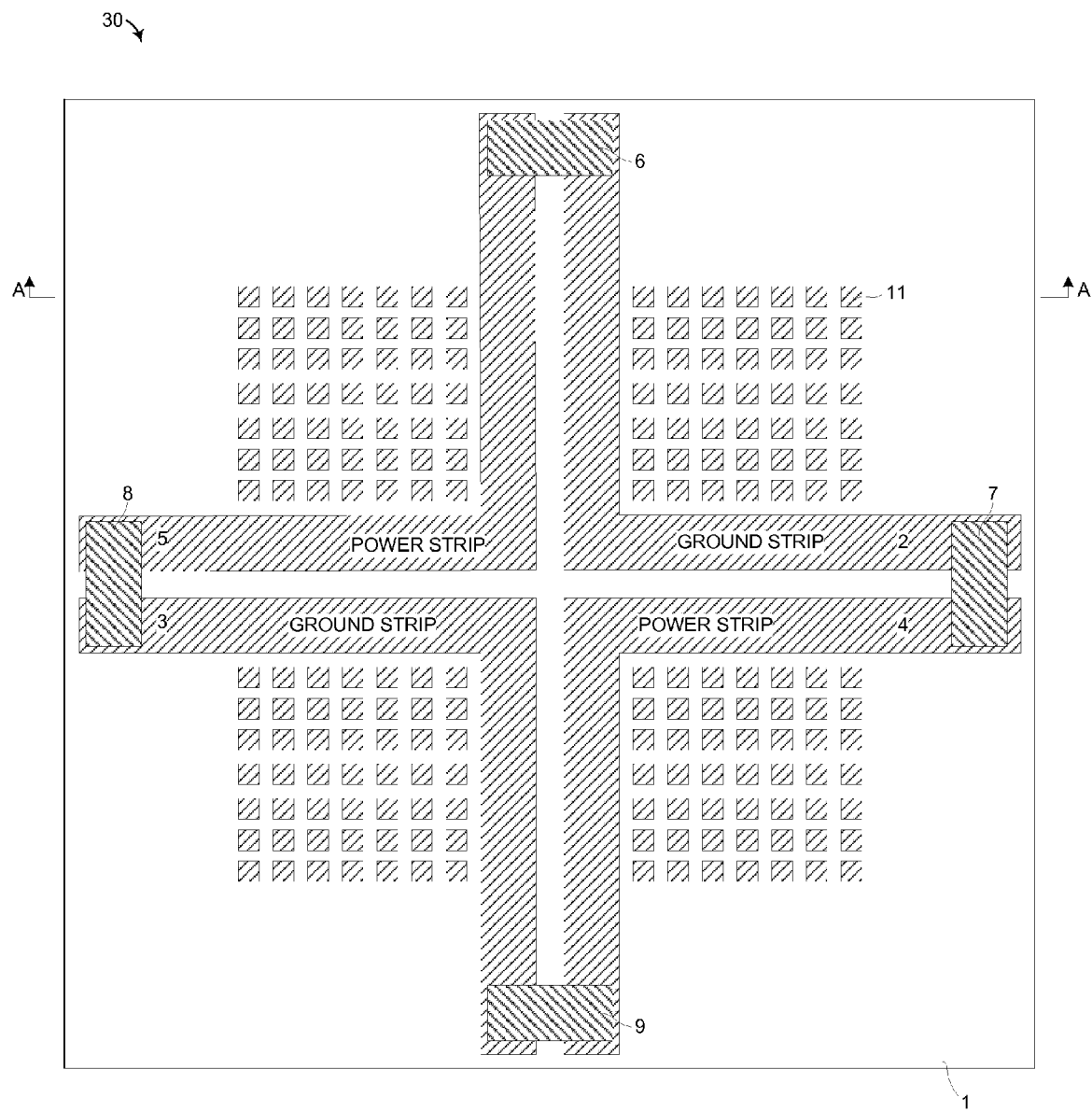
FIG. 2 is a top view of the flip-chip package substrate of FIG. 1 after decoupling capacitors have been bonded to the flip-chip package substrate such that each decoupling capacitor electrically couples to a ground strip and to a power strip, in accordance with an embodiment of the present invention.
Figure 3:
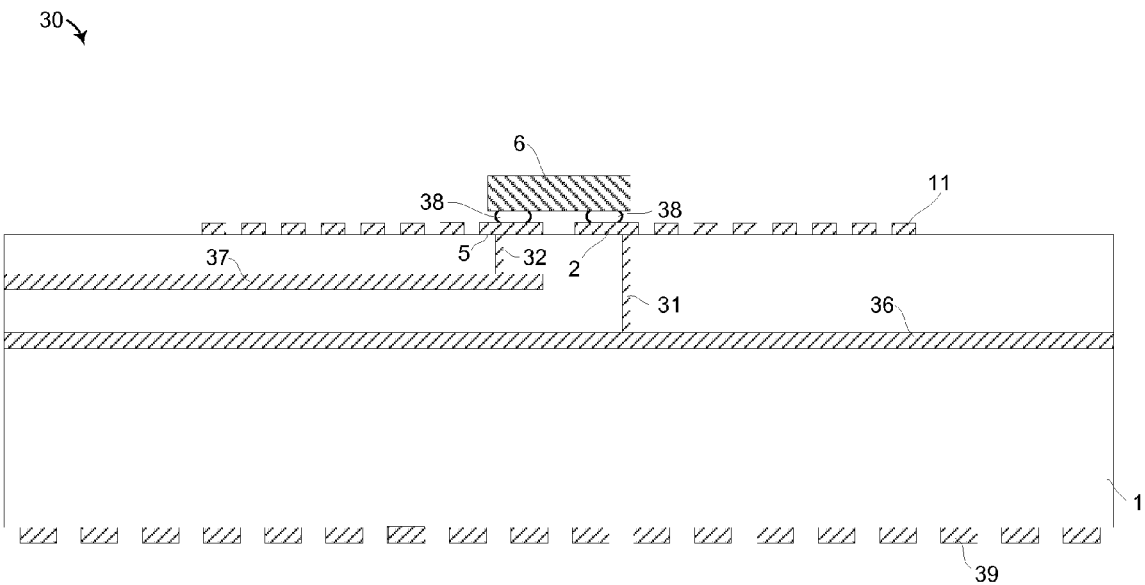
FIG. 3 is a cross sectional view along section A-A shown in FIG. 2, in accordance with an embodiment of the present invention.

FIGS. 1-3 show a package for an integrated circuit device 30 that can be formed in accordance with the method of the present invention. Referring now to FIG. 1, a package substrate 1 is shown that includes ground strips 2-3, power strips 4-5 and contacts 11. In the present embodiment, ground strips 2-3, power strips 4-5 and contacts 11 are formed of electrically conductive material that extends over the top surface of package substrate 1.

Referring now to FIG. 2, decoupling capacitors 6-9 are shown that are disposed over, and electrically coupled to, ground strips 2-3 and power strips 4-5. More particularly, decoupling capacitor 6 is electrically coupled to ground strip 2 near one end of ground strip 2 and decoupling capacitor 7 is electrically coupled to ground strip 2 near the other end of ground strip 2. Decoupling capacitor 8 is electrically coupled to ground strip 3 near one end of ground strip 3 and decoupling capacitor 9 is electrically coupled to ground strip 3 near the other end of ground strip 3.

Continuing with FIG. 2, decoupling capacitor 6 is electrically coupled to power strip 5 near one end of power strip 5 and decoupling capacitor 8 is electrically coupled to power strip 5 near the other end of power strip 5. Decoupling capacitor 7 is electrically coupled to power strip 4 near one end of power strip 4 and decoupling capacitor 9 is electrically coupled to power strip 4 near the other end of power strip 4.

Referring now to FIG. 3, in the present embodiment decoupling capacitors 6-9 are semiconductor die that are mechanically and electrically coupled to ground strips 2-3 and power strips 4-5 by solder 38. More particularly, in the present embodiment solder regions 38 directly electrically and mechanically couple to ground pads and to an underlying ground strip 2-3 for coupling each decoupling capacitor to ground. Similarly, solder regions 38 electrically and mechanically couple to power pads of decoupling capacitors 6-9 and to an underlying power strip 4-5 for coupling each decoupling capacitor to power.

Continuing with FIG. 3, microvias 31 that extend within package substrate 1 electrically couple each of ground strips 2-3 to a ground plane 36. More particularly, one or more microvia 31 electrically couples ground strip 2 to ground plane 36 and one or more microvia 31 electrically couples ground strip 3 to ground plane 36. Similarly, microvias 32 electrically couple each of power strips 4-5 to a power plane 37 in package substrate 1. More particularly, one or more microvia 32 electrically couples power strip 4 to power plane 36 and one or more microvia 32 electrically couples power strip 5 to power plane 37.

In the present embodiment package 30 is a ball grid array flip-chip package. More particularly, it includes contacts 39 that are arranged in a pattern along the bottom of semiconductor substrate, that receive solder balls to form a ball grid array. Moreover, it is designed to receive an integrated circuit device that is a flip-chip semiconductor die.

Figure 4:
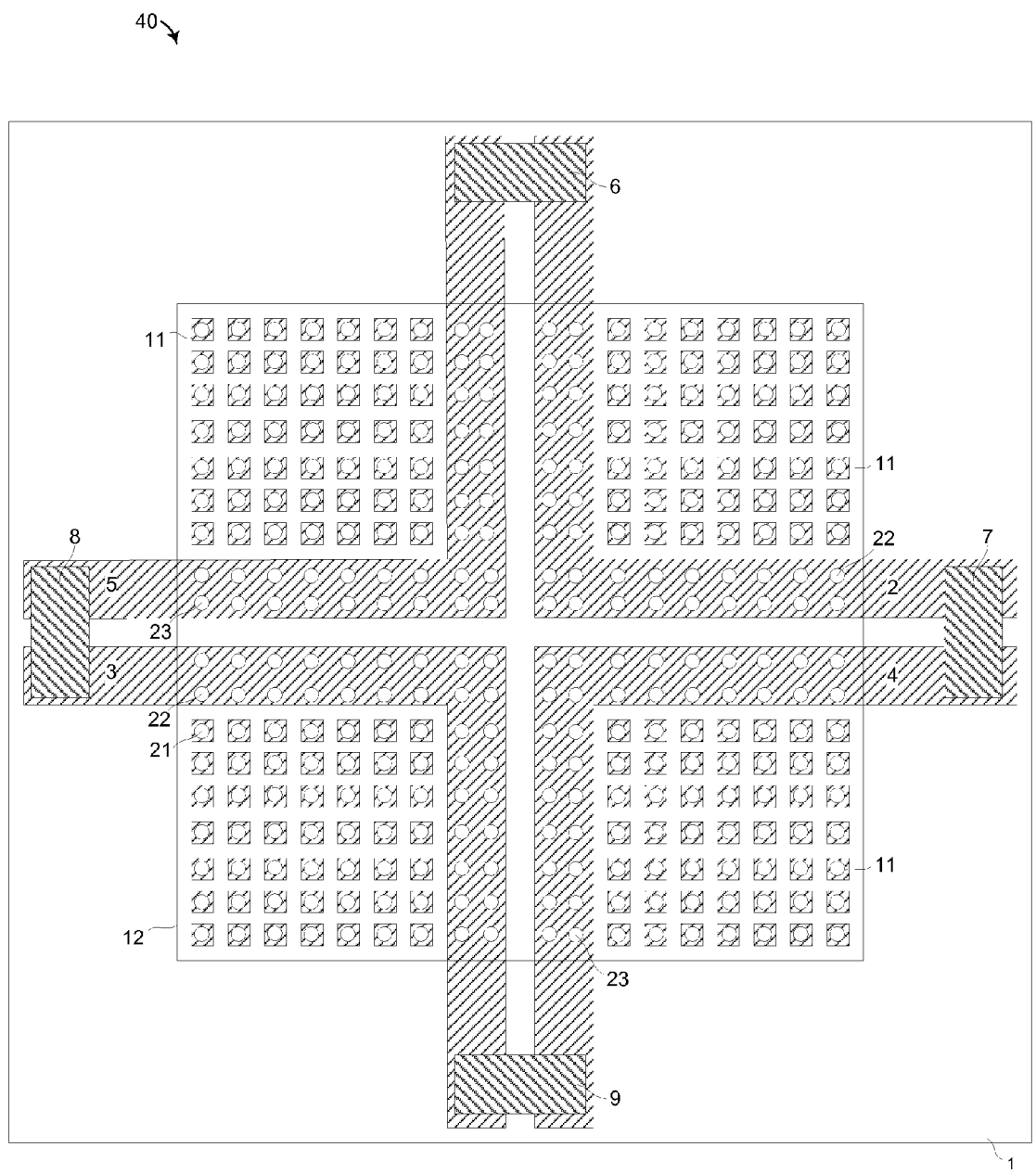
FIG. 4 is a top view of the flip-chip package substrate of FIG. 2 after a flip-chip semiconductor die has been coupled thereto using solder bumps, where only the outline of the semiconductor die is shown so as to clearly indicate the solder bump pattern, in accordance with an embodiment of the present invention.

FIG. 4 shows a packaged integrated circuit device 40 that can be formed by attaching a flip-chip semiconductor die 12 to package 30 shown in FIGS. 2-3. Semiconductor die 12 is mechanically and electrically coupled to package substrate 1 through solder bumps 21-23. More particularly, solder bumps 23 mechanically and electrically connect die 12 to power strips 4-5 and are referred to hereinafter as power solder bumps. Solder bumps 22 mechanically and electrically connect die 12 to ground strips 2-3 and are referred to hereinafter as ground solder bumps. Other solder bumps 21 electrically and mechanically couple die 12 to contacts 11. It is appreciated that the number of solder bumps 21-23 will vary depending on the functionality and layout of semiconductor die 12 and that other solder bumps 21 can couple data and instructions as well as power and ground to semiconductor die 12.

The region of package substrate 1 to which the semiconductor die is to be attached, that can be referred to as the die attach region, is shown in FIG. 4 as the region underlying semiconductor die 12. In the present embodiment power strips 4-5 and ground strips 2-3 extend within this die attach region of package substrate 1, allowing semiconductor die 12 to be bonded thereto for coupling power and ground between semiconductor die 12 and decoupling capacitors 6-9.

In the present embodiment semiconductor die 12 includes a contact pattern in which ground contacts are disposed in patterns of contiguous contacts that extend from near the center of semiconductor die 12 toward an edge of semiconductor die 12. Similarly, power contacts are disposed in patterns of contiguous contacts that extend from near the center of semiconductor die 12 toward the edges of semiconductor die 12.

In the embodiment shown in FIG. 3, each ground solder bump 22 attaches to a corresponding ground contact on semiconductor die 12 and each power solder bump 23 attaches to a corresponding power contact on semiconductor die 12. This gives a solder bump pattern in which ground solder bumps 22 are disposed in patterns of contiguous solder bumps 22 that extends from near the center of semiconductor die 12 toward an edge of semiconductor die 12. Also, power solder bumps 23 are disposed in patterns of contiguous power solder bumps 23 that extend from near the center of semiconductor die 12 toward the edges of semiconductor die 12.

In the embodiment shown in FIGS. 1-4 power strips 4-5 and ground strips 2-3 each have a shape that is angled at a ninety degree angle, with an apex that is located near the center of the die attach region. However, it is appreciated that many different alternate embodiments are possible, depending on the number of decoupling capacitors required and the characteristics of the integrated circuit device to be packaged.

Figure 5:
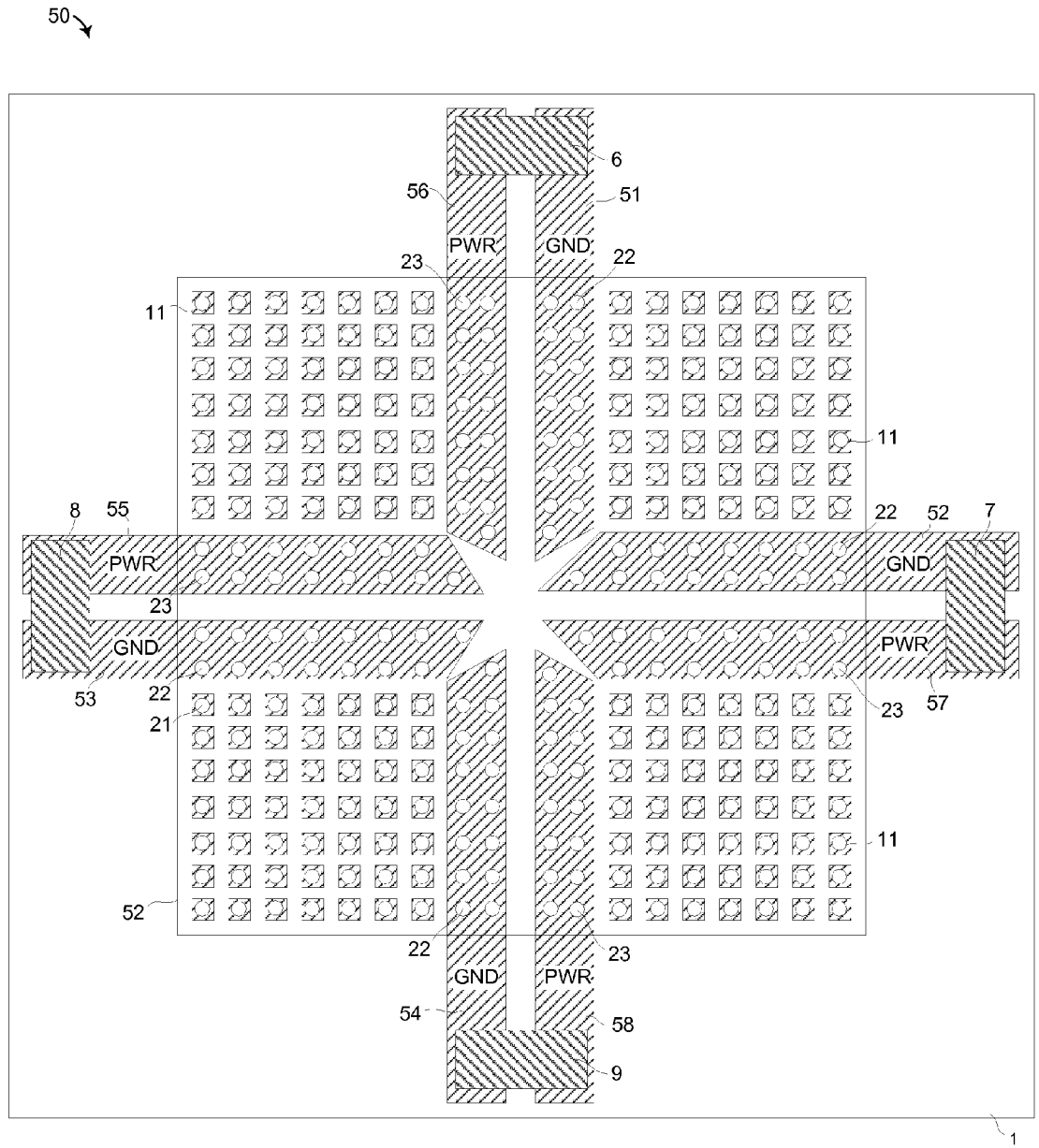
FIG. 5 is a block diagram of an embodiment in which four power strips and four ground strips couple to four decoupling capacitors, where only the outline of the semiconductor die is shown, in accordance with an embodiment of the present invention.

FIG. 5 shows an embodiment that includes a semiconductor die 52 that is coupled to a package that includes four power strips 55-58 and four ground strips 51-54. In the present embodiment, the structure of FIG. 5 is formed in the same manner as in the embodiment shown in FIGS. 1-4.

Continuing with FIG. 5, power strips 55-58, ground strips 51-54 and contacts 11 are formed of electrically conductive material that extends over the top surface of package substrate 1. One end of each of ground strips 51-54 and power strips 55-58 extends near the edges of package substrate 1 and the other end of each of ground strips 51-54 and power strips 55-58 extends near the center of the die attach region.

Decoupling capacitors 6-9 are disposed over, and electrically coupled to, power strips 55-58 and ground strips 51-54. More particularly, decoupling capacitor 6 is electrically coupled to ground strip 51 near one end of ground strip 51 and the other end of ground strip 51 extends near the center of the die attach region. Decoupling capacitor 6 is electrically coupled to power strip 56 near one end of power strip 56 and the other end of power strip 56 extends near the center of the die attach region. Decoupling capacitor 7 is electrically coupled to ground strip 52 near one end of ground strip 52 and the other end of ground strip 52 extends near the center of the die attach region. Decoupling capacitor 7 is electrically coupled to power strip 57 near one end of power strip 57 and the other end of power strip 57 extends near the center of the die attach region. Decoupling capacitor 8 is electrically coupled to ground strip 53 near one end of ground strip 53 and the other end of ground strip 53 extends near the center of the die attach region. Decoupling capacitor 8 is electrically coupled to power strip 55 near one end of power strip 55 and the other end of power strip 55 extends near the center of the die attach region. Decoupling capacitor 9 is electrically coupled to ground strip 54 near one end of ground strip 54 and the other end of ground strip 54 extends near the center of the die attach region. Similarly, decoupling capacitor 9 is electrically coupled to power strip 58 near one end of power strip 58 and the other end of power strip 58 extends near the center of the die attach region.

Still referring to FIG. 5, semiconductor die 52 is coupled to the package in the same manner as in the embodiment shown in FIGS. 1-4. However, the pattern of ground bumps 22 and power bumps 23 is altered to accommodate the shape of ground strips 51-54 and power strips 55-58. In the present embodiment semiconductor die 52 includes a contact pattern in which ground contacts are disposed in patterns of contiguous contacts that extend from near the center of the semiconductor die toward an edge of the semiconductor die. Similarly, power contacts are disposed in patterns of contiguous contacts that extend from near the center of the semiconductor die toward the edges of the semiconductor die. This gives a solder bump pattern in which ground solder bumps 22 are disposed in patterns of contiguous solder bumps 22 that extends from near the center of the semiconductor die toward an edge of the semiconductor die. Also, power solder bumps 23 are also disposed in patterns of contiguous power solder bumps 23 that extend from near the center of the semiconductor die toward the edges of the semiconductor die.

Power strips 4-5 and ground strips 2-3 provide low impedance pathways between semiconductor die 12 and each decoupling capacitor 6-9. Thereby, effective decoupling capacitance is provided that is suitable for high frequency applications. Moreover, since the electrical pathway between semiconductor die 12 and decoupling capacitors 6-9 does not have to pass through any microvias, the impedance of the electrical pathway between semiconductor die 12 and decoupling capacitors 6-9 is significantly less than that of prior art packages that include multiple microvias between the semiconductor die and decoupling capacitors.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A package for an integrated circuit device comprising:
a package substrate;
a plurality of ground strips disposed on the top surface of the package substrate;
a plurality of power strips disposed on the top surface of the package substrate; and
a plurality of decoupling capacitors, each decoupling capacitor disposed over and attached to the top surface of a ground strip, and each decoupling capacitor disposed over and attached to the top surface of a power strip, each ground strip and each power strip extending within a die attach region such that a semiconductor die can be coupled to the top surface of each power strip and coupled to the top surface of each ground strip for coupling power and ground between the semiconductor die and the decoupling capacitors.

2. A device as recited in claim 1 wherein each decoupling capacitor is a semiconductor die that is attached to one of the ground strips using solder and is attached to one of the power strips using solder.

3. A device as recited in claim 2 wherein the plurality of ground strips comprise a first ground strip and a second ground strip, wherein the plurality of power strips comprise a first power strip and a second power strip, and wherein a portion of each of the first ground strip, the second ground strip, the first power strip and the second power strip extend near the center of the die attach region.

4. A device as recited in claim 1 wherein the package substrate includes a ground plane, a power plane, a first set of microvias and a second set of microvias, the first set of microvias extending between the power strips and the power plane for coupling power to each of the power strips, and the second set of microvias extending between the ground strips and the ground plane for coupling ground to each of the ground strips.

5. A package for an integrated circuit device comprising:
a package substrate;
a first ground strip and a second ground strip disposed on the top surface of the package substrate, a portion of each of the first ground strip and the second ground strip extending near the center of a die attach region;
a first power strip and a second power strip disposed on the top surface of the package substrate, a portion of each of the first power strip and the second power strip extending near the center of the die attach region;
a first decoupling capacitor that is electrically coupled to the first ground strip proximate one end of the first ground strip and electrically coupled to the first power strip proximate one end of the first power strip;
a second decoupling capacitor that is electrically coupled to the first ground strip proximate the other end of the first ground strip and electrically coupled to the second power strip proximate one end of the second power strip;
a third decoupling capacitor that is electrically coupled to the second ground strip proximate one end of the second ground strip and electrically coupled to the first power strip proximate the other end of the first power strip; and
a fourth decoupling capacitor that is electrically coupled to the second ground strip proximate the other end of the second ground strip, and electrically coupled to the second power strip proximate the other end of the second power strip.

6. A device as recited in claim 5 wherein each decoupling capacitor is a semiconductor die that is attached to one of the ground strips using solder and is attached to one of the power strips using solder.

7. A packaged integrated circuit device comprising:
a package substrate;
a first ground strip and a second ground strip disposed on the top surface of the package substrate, a portion of each of the first ground strip and the second ground strip extending near the center of a die attach region;
a first power strip and a second power strip disposed on the top surface of the package substrate, a portion of each of the first power strip and the second power strip extending near the center of the die attach region;
a semiconductor die disposed over the package substrate, the semiconductor die disposed over and electrically coupled to a portion of each power strip, and disposed over and electrically coupled to a portion of each ground strip;
a first decoupling capacitor that is electrically coupled to the first ground strip proximate one end of the first ground strip and electrically coupled to the first power strip proximate one end of the first power strip;
a second decoupling capacitor that is electrically coupled to the first ground strip proximate the other end of the first ground strip and electrically coupled to the second power strip proximate one end of the second power strip;
a third decoupling capacitor that is electrically coupled to the second ground strip proximate one end of the second ground strip and electrically coupled to the first power strip proximate the other end of the first power strip; and
a fourth decoupling capacitor that is electrically coupled to the second ground strip proximate the other end of the second ground strip, and electrically coupled to the second power strip proximate the other end of the second power strip.

8. A device as recited in claim 7 wherein the first ground strip and the second ground strip have a shape that is angled at a ninety-degree angle, and wherein the first power strip and the second power strip have a shape that is angled at a ninety degree angle.

9. A device as recited in claim 7 wherein each decoupling capacitor comprises a semiconductor die that is attached to one of the ground strips using solder and that is attached to one of the power strips using solder.

10. A packaged integrated circuit device comprising:
a package substrate;
four ground strips disposed on the top surface of the package substrate, one end of each of the ground strips extending near the center of the semiconductor die and the other end extending near the edge of the package substrate;
four power strips disposed on the top surface of the package substrate, one end of each of the power strips extending near the center of the semiconductor die and the other end extending near the edge of the package substrate;
a semiconductor die disposed over the package substrate, the semiconductor die disposed over and electrically coupled to a portion of each power strip, and disposed over and electrically coupled to a portion of each ground strip; and
four decoupling capacitors, each decoupling capacitor disposed over and electrically coupled to a ground strip proximate the end of the ground strip that extends near the edge of the package substrate, and each decoupling capacitor disposed over and electrically coupled to a power strip proximate the end of the power strip that extends near the edge of the package substrate.

11. A device as recited in claim 10 wherein each decoupling capacitor comprises a semiconductor die that is attached to one of the ground strips using solder and that is attached to one of the power strips using solder.

12. A device as recited in claim 10 wherein ground solder bumps electrically couple the semiconductor die to the ground strips, the ground solder bumps disposed in patterns of contiguous ground solder bumps that extend from near the center of the semiconductor die toward an edge of the semiconductor die, and wherein power solder bumps electrically couple the semiconductor die to the power strips, the power solder bumps disposed in patterns of contiguous power solder bumps that extend from near the center of the semiconductor die toward the edges of the semiconductor die.

13. A device as recited in claim 10 wherein the package substrate includes a ground plane, a power plane, a first set of microvias and a second set of microvias, the first set of microvias extending between the power strips and the power plane for coupling power to each of the power strips, and the second set of microvias extending between the ground strips and the ground plane for coupling ground to each of the ground strips.

14. A packaged integrated circuit device comprising:
a package substrate;
four ground strips disposed on the top surface of the package substrate, one end of each of the ground strips extending near the center of the semiconductor die and the other end extending near the edge of the package substrate;
four power strips disposed on the top surface of the package substrate, one end of each of the power strips extending near the center of the semiconductor die and the other end extending near the edge of the package substrate; and
four decoupling capacitors, each decoupling capacitor disposed over and electrically coupled to a ground strip proximate the end of the ground strip that extends near the edge of the package substrate, and each decoupling capacitor disposed over and electrically coupled to a power strip proximate the end of the power strip that extends near the edge of the package substrate.

* * * * *